United States Patent
Jung

[11] Patent Number: 5,781,042
[45] Date of Patent: Jul. 14, 1998

[54] MODAL TRANSITION IMBALANCE DETECTOR

[75] Inventor: Peter J. Jung, Eagan, Minn.

[73] Assignee: VTC Inc., Bloomington, Minn.

[21] Appl. No.: 847,304

[22] Filed: Apr. 24, 1997

Related U.S. Application Data

[63] Continuation of Ser. No. 531,192, Sep. 19, 1995, abandoned.

[51] Int. Cl.$^6$ ........................................................ G11B 5/02
[52] U.S. Cl. ............................ 327/67; 327/70; 327/73; 360/67
[58] Field of Search ........................... 327/63, 65, 66, 327/67, 69, 72, 73, 96, 70; 360/46, 67

[56] References Cited

U.S. PATENT DOCUMENTS

| | | | |
|---|---|---|---|
| 4,280,100 | 7/1981 | Dann | 329/103 |
| 4,388,699 | 6/1983 | Balakrishnan | 365/8 |
| 4,706,138 | 11/1987 | Jove et al. | 360/67 |
| 4,833,346 | 5/1989 | Marple | 327/73 |
| 5,270,882 | 12/1993 | Jove et al. | 360/67 |
| 5,329,173 | 7/1994 | Murakami et al. | 327/63 |
| 5,426,542 | 6/1995 | Smith | 360/67 |
| 5,444,579 | 8/1995 | Klein et al. | 360/67 |

FOREIGN PATENT DOCUMENTS

| | | | |
|---|---|---|---|
| 0595266 | 4/1994 | European Pat. Off. | 360/67 |

*Primary Examiner*—Timothy P. Callahan
*Assistant Examiner*—Terry L. Englund
*Attorney, Agent, or Firm*—Kinney & Lange, P.A.

[57] ABSTRACT

A magnetoresistive sensor and preamplifier system has an excess differential imbalance detector, (a) for detecting magnitude differences between a pair of signals occurring at the output of a preamplifier subsystem due to modal transitions, and (b) for initiating action to overcome same. The excess imbalance detector changes a threshold therein to become more sensitive to smaller imbalances in the output signals being monitored after detection of a modal transition imbalance.

11 Claims, 3 Drawing Sheets

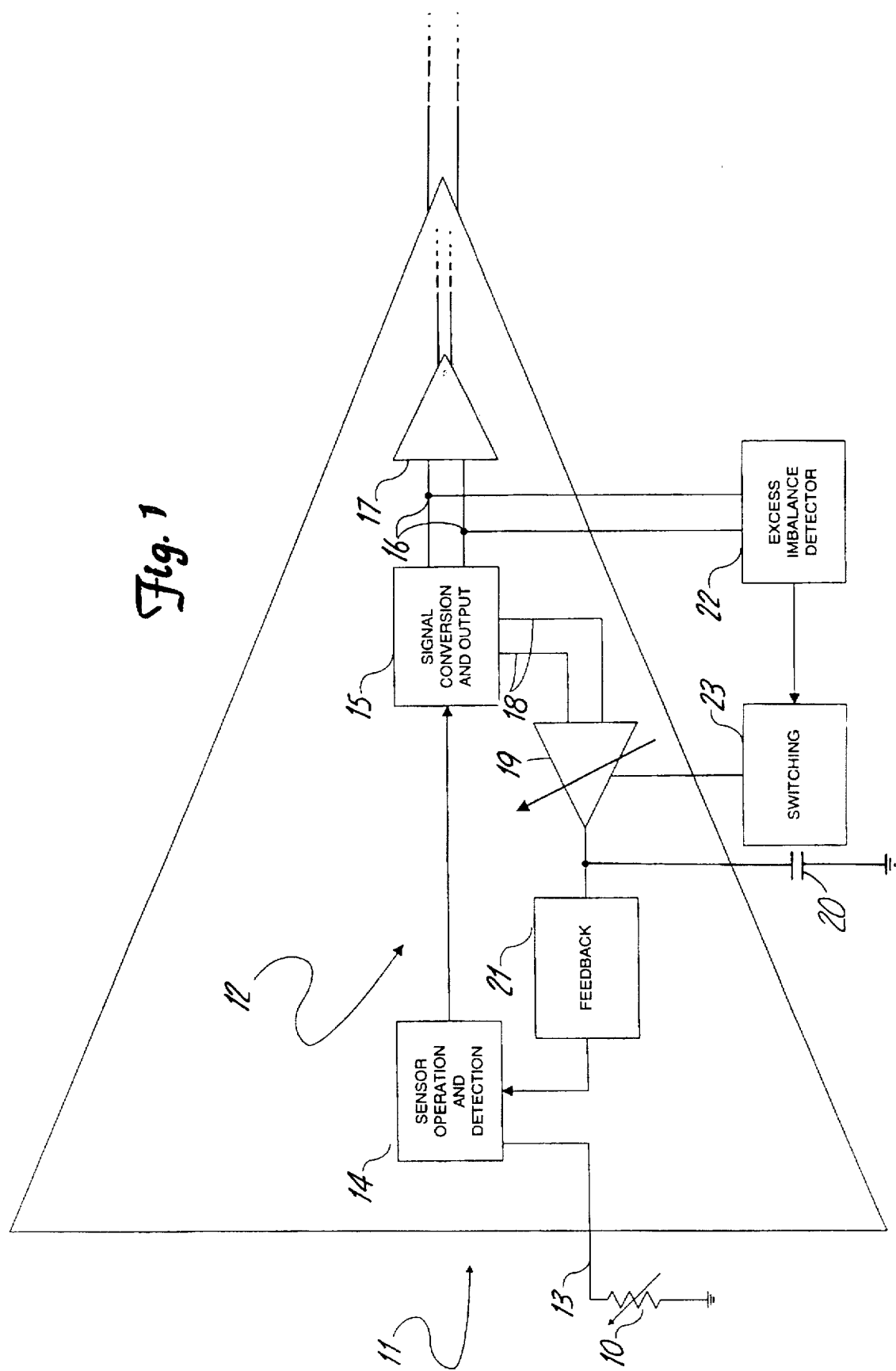

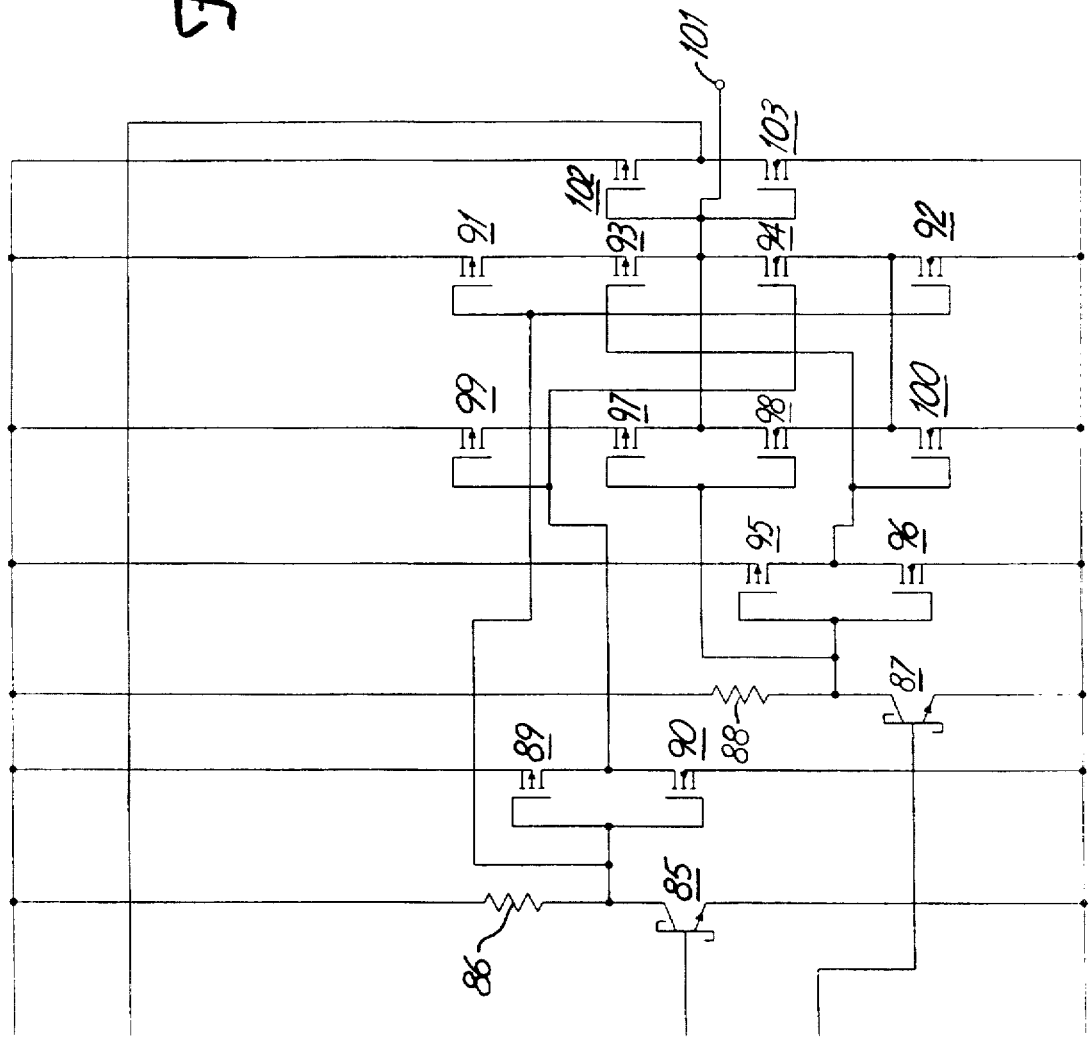

MODAL TRANSITION IMBALANCE DETECTOR

This is a continuation of application Ser. No. 08/531,192, filed Sep. 19, 1995, now abandoned.

BACKGROUND OF THE INVENTION

The present invention relates to circuits used with magnetoresistive sensors for sensing information stored in magnetic storage media and, more particularly, to circuits used in connection with amplifying signals resulting from such a sensor sensing those magnetic fields in the storage media in the presence of substantial changes in the sensing conditions.

Magnetic media based storage systems include magnetic sensors for use in retrieving information from the magnetic recording material such as a magnetic film in a magnetic media such as a magnetic disk. Traditionally, such magnetic sensor was an inductive sensor. However, more recently, there has been increasing use of magnetoresistive sensors rather than inductive sensors because of some advantages such magnetoresistors have over inductive sensors such as smaller size. Magnetoresistive sensors retrieve information from the magnetic storage medium by sensing changes in localized magnetic fields in tiny portions of the medium in which information for a binary bit is magnetically stored to provide a representation therefor in that medium. A current is established through the magnetoresistive sensor, and the magnetically induced resistance changes in the sensor due to changes in the localized magnetic field result in either current changes through, or voltage changes across, that sensor representative of those changes in the localized magnetic fields and therefore of the stored bits.

These changes in the current through, or voltage across, such a magnetoresistive sensor are typically amplified in a preamplifier circuit to which that sensor is connected. Although there is a strong desire to have the magnetoresistive sensor connected on one side thereof to ground to minimize the voltage difference between that sensor and the magnetic media, the magnetically induced electrical changes in the sensor are typically either sensed differentially by, or converted to differential signals in, the preamplifier circuit. After such differential signals are initially developed at some stage of the preamplifier circuit, the differential output signals developed at that stage may then be further amplified by additional differential amplifier stages in the preamplifier circuit. Thus, any imbalances in the circuitry used to generate these differential signals, which are reflected as offset signal portions in such differential signals, can easily lead to offsets that become quite large fractions of those signals leading to erroneous output information, and so must be controlled.

Some kinds of preamplifier circuits for magnetoresistive sensors, in operating such sensors and converting the information obtained from the localized magnetic fields into differential signals, require the use therein of capacitances of substantial values. The need to have the magnetoresistive sensors and the preamplifier circuit in such systems switch between different operating states, i.e. modal transitions, can lead to large offset portions occurring in such differential outputs signals. Such modal transitions typically include having the magnetic storage system change from an information storage operating mode to an information retrieval operating mode, or from an idle mode to an information retrieval mode, both of which involve changing the operating status of the magnetoresistive sensor and the preamplifier circuit from a low or no electrical power drawn status to a fully electrically powered status. In another type of mode transition, a magnetic storage system may change from using one magnetoresistive sensor to another magnetoresistive sensor which operates under differential electrical conditions than the former. The associated changes in electrical conditions in the magnetoresistive sensor or sensors and the preamplifier circuit will, in the absence of compensating measures, be significantly delayed by the need to change the voltage values across the capacitors used in the preamplifier circuit.

Such delays can be minimized by the use of supplementary circuitry such as capacitance charging circuits to rapidly charge the preamplifier capacitances during a selected period of time sufficient for a modal transition to be completed. Another alternative is to use greater amplification in some stage or stages of the preamplifier circuit during the modal transition so that the internal preamplifier circuitry can more rapidly charge or discharge such capacitances. Such measures require either the system controller to note the occurrence of a modal transition and therefore provide control signals to such capacitance charging circuits or amplification enhancement circuits, or to have a modal transition detector and internal timing circuits added to supply such control signals. Such methods of generating control signals have either added to the processing required of the system controller for each kind of modal transition, or have required several different modal transition detection circuits and internal timing circuits, that is, one for each kind of modal transition because of the differences in circuit conditions occurring for each kind of modal transition. Thus, there is a desire for a single modal detection arrangement suitable for providing control signals to a modal transition accommodation arrangement suited for use with each kind of modal transition.

SUMMARY OF THE INVENTION

The present invention provides a magnetoresistive sensor and preamplifier system having an excess differential imbalance detector for detecting magnitude differences between a pair of signals occurring at the output of a circuit being monitored, such as a sensor operation and signal conversion subsystem in the preamplifier. Such differences can become excessive during modal transitions between different operating states for the sensor and preamplifier system due to substantial capacitances used in such a subsystem therein.

The excess imbalance detector provides an output signal indicating when the magnitude differences between the output signals of the subsystem being monitored have reached selected threshold voltages and when they have not. A switching arrangement connected to the output of the excess imbalance detector changes, when directed to do so by the detector, the amplification of an amplifier in the subsystem that is capable of charging or discharging the substantial capacitance therein so as to increase the amplification factor thereof when a modal transition is indicated by a large imbalance in the subsystem output signals. The excess imbalance detector also changes its threshold to become more sensitive to smaller differences in the subsystem output signals to result in keeping the amplifier at a high amplification factor until the differences between the output signals of the subsystem reach a sufficiently small magnitude by the completion of the charging or discharging of the capacitance.

A differential comparator is used in the excess imbalance detector to determine whether the output signals of the

3 subsystem have differences between them sufficient to cause the differential comparator outputs to reach an initial threshold or not. A signal status determiner uses this information at the differential comparator outputs to provide a logic signal indicative of whether such differences have reached the initial threshold or not, and to operate a threshold adjuster to change the threshold in the differential comparator from its initial value to a subsequent value when the differences have reached the initial threshold.

BRIEF DESCRIPTION OF THE DRAWINGS

FIG. 1 shows a mixed block and electrical circuit schematic diagram embodying the present invention; and FIGS. 2A and 2B show an electrical circuit diagram of an aspect of the present invention.

DETAILED DESCRIPTION OF THE PREFERRED EMBODIMENTS

Figure 2A:
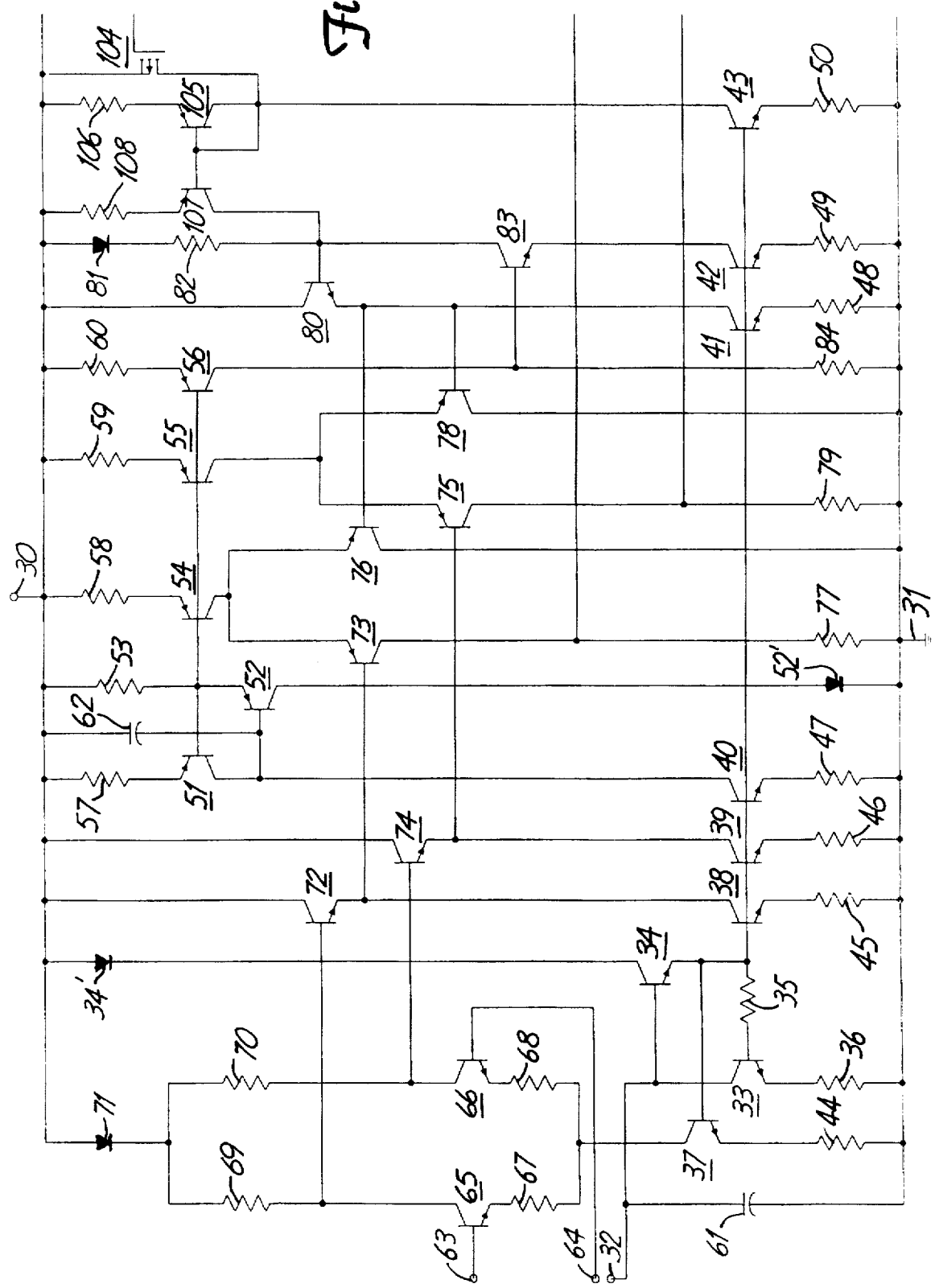

FIG. 1 shows a mixed block and electrical circuit schematic diagram of a magnetoresistive sensor, 10, and a preamplifier, 11, used both to operate sensor 10 and to convert resistance changes therein due to changing magnetic fields thereabout (the basis for representing the sensor as a variable resistor in the figure) to corresponding differential voltage output signals. A magnetoresistive sensor operation and signal conversion subsystem, 12, in preamplifier 11 is shown in a mixed block and electrical circuit schematic diagram within that preamplifier. Subsystem 12, and so preamplifier 11, are electrically connected to sensor 10 by an interconnection, 13.

Magnetoresistive sensor 10 is electrically connected to subsystem 12 at a sensor operation and detection block, 14, therein. The apparatus of block 14 provides an electrical current through magnetoresistive sensor 10 for its operation, and detects either changes in the current therethrough or changes in the voltage drop thereacross as a result of changes in the resistance of magnetoresistive sensor 10 due to changes in the magnetic fields thereabout generated by the localized bit storage regions in the magnetic media moving past sensor 10. Such detected resistance changes are converted to differential signals in a further signal conversion and output block, 15, which signals are provided at a pair of outputs, 16, thereof as a pair of signals with there being one such signal on each such output such that the differences therebetween are equivalent to the desired differential signals. These differential signals are provided as inputs to a further amplifier, 17, from which they are transmitted to other portions of the magnetic storage system to effectively transmit the information contained therein.

Some version of these differential signals is also provided by signal conversion and output block 15 at a further pair of outputs, 18, where they are provided to the inputs of a variable amplification amplifier, 19. Amplifier 19 is used to charge a capacitor, 20, in accord with the differential signals on its inputs generated in signal conversion and output block 15, and to provide corresponding signals to a further feedback block, 21. These feedback signals, as stored on a time average basis in capacitor 20 in being applied to feedback block 21, are used in maintaining the desired current in magnetoresistive sensor 10 in connection with the detection of resistance changes therein. Because of the desire to store the average of these signals on capacitance 20, the output impedance of amplifier 19 must be relatively high and so a transconductance amplifier is often used therefor. Hence, the variable amplification in amplifier 19 is a change in the transconductance value applied thereby to its input signals in

4 developing an output signal therefrom. Typically, the input impedance to feedback block 21 is also relatively high. A fuller description of the circuitry like that used in subsystem 14 is provided in a related application by the present inventor entitled "Single-Ended Cascode Amplifier for Magnetoresistive Sensors" having Ser. No. 08/530,005 which is hereby incorporated herein by reference.

As described above, the need for modal transitions in the operation of magnetic storage systems between various operating modes including retrieving information, storing information or idling, or changing in the information retrieval mode from one storage-retrieval head to another, leads to changes in the operational states of magnetoresistive sensor 10 and preamplifier 11. In some situations, established electrical current through magnetoresistive sensor 10 and preamplifier 11 will be terminated, while in other situations current will be reinitiated through magnetoresistive sensor 10 and preamplifier 11 placing them back in a fully operational condition.

However, the charge stored on capacitance 20, and possibly on other capacitances used in subsystem 14, will retard subsystem 14, and so preamplifier 11, from reaching its new operating state as these capacitances are either charged or discharged toward their new operating condition. The relatively fast changing of electrical conditions in other portions of subsystem 14 while voltages on capacitance 20 and other capacitances therein change relatively more slowly leads to substantial imbalances in the signals appearing on each of outputs 16 of conversion and output block 15, i.e. large differential signals will occur well in excess of those encountered during normal sensing operations of magnetoresistive sensor 10 and preamplifier 11. These large differential signals, or imbalances between signals on outputs 16, can be sensed as a basis for changing the rate at which capacitance 20 and other capacitances in subsystem 12 are charged or discharged during a modal transition.

Such sensing is accomplished by use of an excess imbalance detector, 22, shown in FIG. 1 having a pair of inputs electrically connected to outputs 16 of signal conversion and output block 15. A differential comparator in detector 22 compares the differences between the signals occurring on outputs 16 against an initial threshold value established in that detector. If that threshold value is not exceeded as indicated at the threshold comparator output, a signal status determiner in detector 22 determines from the threshold comparator output that normal operations in the current operating mode of the magnetic storage system are continuing with no need for action to occur involving altering preamplifier 11 capacitance charging or discharging conditions to accommodate modal transitions. If, however, that initial threshold is exceeded, the signal status determiner determines from the threshold comparator output that normal operations in the current operating mode of the magnetic storage system have ended because of a modal transition underway, and that action is needed to change capacitance charging and discharging conditions in preamplifier 11 with this determiner then providing a detector output signal directing same.

This output signal indication from the signal status determiner is provided to a switching arrangement, 23, in FIG. 1. Switching arrangement 23 then acts to effectively increase the transconductance value of amplifier 19 to enable it to charge or discharge capacitance 20 at a significantly greater rate, and may direct operation of charging or discharging circuits for other substantial capacitances used in preamplifier 11. In addition, the signal status determiner output signal activates a threshold adjuster in detector 22 to reduce the threshold in the differential comparator therein to a lower value to thereby in effect require the changes in magnetoresistive sensor 10 and preamplifier 11 to be essentially complete before switching arrangement 23 is directed to return amplifier 19 to its normal operational transconductance value for the new mode of operation, and to return to the previous state any other circuits controlled thereby.

An electrical schematic for excess imbalance detector 22 is shown in FIGS. 2A and 2B. This circuit is operated between a positive voltage supply terminal, 30, suited for connection to a source of positive voltage, and a ground reference, 31. A typical voltage value for such a positive voltage source would be 5.0 volts. In addition, a further terminal, 32, is adapted for connection to a source of a substantially constant reference current that is used in the circuit portion of FIG. 2A in a npn transistor based current sink arrangement therein based on current mirror circuitry. This current sink arrangement, in turn, operates a pnp transistor based current source arrangement again depending on current mirror circuitry.

The npn transistor current sink arrangement of FIG. 2A is based on having the constant reference current supplied at terminal 32 directed to the collector of a npn bipolar transistor, 33, and to the base of another npn bipolar transistor, 34. A diode, 34', having its anode connected to positive voltage supply terminal 30, has its cathode connected to the collector of transistor 34 to protect that transistor collector-base junction from breakdown. The emitter of transistor 34 is connected through a resistor, 35, to the base of transistor 33. The emitter of transistor 33 is connected through a further resistor, 36, to ground reference terminal 31. The emitter of transistor 34 is also connected to the bases of several npn bipolar transistors, 37, 38, 39, 40, 41, 42 and 43, each used in a corresponding current mirror circuit. The emitters of each of these transistors are connected through a corresponding resistor to ground terminal 31, that is, the emitters of transistors 37 through 43 are so connected by resistors 44 through 50.

This arrangement is a well known current sink arrangement in which current for the bases of transistors 33 and 37 through 43 are supplied by the emitter of transistor 34. The voltage occurring at the bases of transistors 37 through 43 is set by the voltage at the base of transistor 33 needed to accommodate the reference current of terminal 32 less the base current of transistor 34, plus the voltage drop across resistor 35. This latter voltage drop across resistor 35 is added to the voltages at the base of transistors 37 through 43 to increase the collector current of transistors 37 and 42 to compensate the alpha loss from emitter to collector of transistors 65, 66 and 83, respectively. Such a circuit arrangement allows the collector currents of current mirror transistors 37 through 43 to substantially match the reference current supplied at terminal 32, or some multiple thereof as set by the ratio of the resistance value of the emitter resistors for each of the current mirroring transistors to the resistance value of resistor 36. Typical resistance values used are 808 Ω for resistors 35, 36, 47 and 49, 404 Ω for resistor 44, and 1616 Ω for resistors 45, 46, 48 and 50.

The current sunk at the collector of transistor 40 serves as a reference current for a pnp transistor based current source arrangement in being drawn from the collector of a pnp bipolar transistor, 51, connected thereto and the base of a further pnp bipolar transistor, 52, connected thereto. Transistor 52 has its collector connected to the anode of a diode, 52', to protect the base-collector junction thereof against breakdown. The current drawn at the emitter of transistor 52 is obtained from the base of transistor 51 to which it is connected, from a resistor, 53, to which it is also connected, and from the bases of further current mirror transistors, 54, 55 and 56, to which it is connected. The current supplied through resistor 53 is used to give a larger current through the emitter and collector of transistor 52 than would occur in its absence to allow that transistor to operate at a higher current gain and so reduce current errors in this pnp transistor current source arrangement.

The voltage at the bases of current mirroring transistors 54, 55 and 56 is set by the voltage occurring at the base of transistor 51 needed to accommodate the reference current drawn by transistor 40 from transistor 51. Again, this arrangement allows the currents at the collectors of transistors 54 through 56 to match that at the collector of transistor 51 since the emitters of each of these transistors are connected by corresponding resistors to positive voltage supply terminal 30 with each of these resistors having a resistance value equalling that of the others, typically 1.194 kΩ. Thus, the emitters of transistors 51 and 54 through 56 are each connected to positive voltage supply terminal 30 through corresponding one of resistors 57 through 60.

A pair of capacitors, 61 and 62, are used in connection with the npn transistor current sink arrangement and the pnp transistor current source arrangement to protect them from supply disturbances or other noise sources which might tend to otherwise upset the current values established therein. Capacitor 61 is connected between ground reference terminal 31 and both the collector of transistor 33 and the base of transistor 34. Capacitor 62 is connected between positive voltage supply terminal 30 and both the collector of transistor 51 and the base of transistor 52.

Excess imbalance detector 22 has a further pair of terminals, 63 and 64, in FIG. 2A serving as input terminals therefor, and as input terminals for the differential comparator used in this detector, and finally as input terminals for the differential amplifier used in this comparator. Input terminals 63 and 64 are connected to the bases of a pair of npn bipolar transistors, 65 and 66, having the emitters thereof connected together through a pair of resistors, 67 and 68. The junction of resistors 67 and 68 is connected to the collector of transistor 37 providing a current sink for the input differential amplifier. Resisters 67 and 68, each typically of a 202 Ω resistance value, aid in balancing any current gain differences between transistors 65 and 66.

This input differential amplifier is completed by a pair of load resistors, 69 and 70, in the collector circuits of transistors 65 and 66, respectively, these load resistors each being connected between the collector of its respective transistor and the cathode of a diode, 71, having its anode connected to positive voltage supply terminal 30. Diode 71 is used to shift the voltages at the collectors of transistors 65 and 66 to lower values than they would otherwise have in this differential amplifier circuit for convenience in operating remaining circuits in excess imbalance detector 22 for which the outputs of the input differential amplifier at the collectors of transistors 65 and 66 serve as input sources. Resistors 69 and 70 typically have resistance values of 2.018 kΩ.

The collector of transistor 65, as an input differential amplifier output, is connected to the base of a further npn bipolar transistor, 72, serving as an emitter follower, and supplying part of the electrical current drawn by the current sink at the collector of transistor 38. The remainder of this electrical current is supplied from the base of a pnp bipolar transistor, 73, serving as one of the input transistors in a first comparator.

The collector of transistor 66, as the other output of the input differential amplifier, is connected to the base of another npn bipolar transistor, 74, also serving as an emitter follower. The emitter of this transistor supplies part of the current drawn by the current sink at the collector of transistor 39. The remainder of the current drawn in the collector of transistor 39 is supplied from the base of another pnp bipolar transistor, 75, serving as the input transistor of a second comparator.

The first comparator containing transistor 73 also has a second input transistor, 76, which again is a pnp bipolar transistor with its emitter connected to the emitter of transistor 73 and to the current source at the collector of transistor 54 so that transistors 73 and 76 together draw the current supplied at that collector. The collector of transistor 73 is connected by a load resistor, 77, to ground reference terminal 3 1. The collector of transistor 76 is directly connected to that same terminal 31.

Similarly, the second comparator containing transistor 75 also has a further input pnp bipolar transistor, 78, having its emitter connected to the emitter of transistor 75 and to the current source at the collector of transistor 55 so that transistors 75 and 78 together conduct the current drawn from the current source at the collector of transistor 55. Transistor 75 has its collector connected through a resistor, 79, to ground reference terminal 31, and the collector of transistor 78 is connected directly to that terminal. Resistors 77 and 79 are of equal resistance value, typically 44.58 kΩ.

Input transistors 76 and 78 of the first and second comparators, respectively, each have the base thereof connected to the output of a threshold circuit provided by the emitter of a further npn bipolar transistor, 80. The collector of transistor 80 is connected to positive voltage supply terminal 30. The emitter of transistor 80, the base of transistor 76, and the base of transistor 78 are all connected to current sink at the collector of transistor 41 to provide the current drawn by that transistor. The base of transistor 80 is supplied current through a diode, 81, with its anode connected to positive voltage supply terminal 30, that is connected in series with a resistor, 82, which in turn is connected to the base of transistor 80 and typically has a resistance value of 2.018 kΩ.

That current supplied by resistor 82 not drawn in the base of transistor 80 is supplied to the collector of a further npn bipolar transistor, 83, connected to that base. The base of transistor 83 is supplied current from the current source at the collector of transistor 56, and that current supplied at the collector of transistor 56 not drawn by the base of transistor 83 is diverted to ground. This is accomplished through the connection of the collector of transistor 56 and of the base of transistor 83 to ground reference terminal 31 through a further resistor, 84, typically having a resistance value of 8.085 kΩ. The emitter of transistor 83 supplies the current drawn by the current sink at the collector of transistor 42.

This threshold circuit provides at its output, the emitter of transistor 80, approximately that voltage which appears at the emitters of the input differential amplifier output emitter follower transistors 72 and 74 when that input differential amplifier is balanced, or nearly balanced, through having no or little voltage difference between input terminals 63 and 64. This is accomplished by having the threshold circuit constructed substantially like the circuit portion forming each side of the input differential amplifier. Thus, the resistance value of transistor 82 matches the resistance values of each of load transistors 69 and 70. Since diode 81 will be conducting just half the current conducted by diode 71 in supplying both sides of the input differential amplifier, the junction area of diode 81 is made just half that of diode 71. Similarly, the current drawn by the collector of transistor 42 is just half that drawn by the current at the collector of transistor 37 which is obtained from both sides of the input differential amplifier. Transistor 83 is provided so as to duplicate the presence of either transistor 65 or 66 on one of the other sides of the input differential amplifier. Thus, when the voltage differences between terminals 63 and 64 of the input differential amplifier are zero or relatively small, the voltages at the bases of input transistors 73 and 76 of the first comparator will be approximately equal, as will the voltages of input transistors 75 and 78 of the second comparator.

The output from the first comparator is taken at the junction of the collector of transistor 73 and resistor 77 which is connected to the base of a Schottky npn bipolar transistor, 85, shown in FIG. 2B, having its emitter connected to ground reference terminal 31. The collector of transistor 85 is connected through a resistor, 86, to positive voltage supply terminal 30, resistor 86 typically having a resistance value of 9.989 kΩ. Thus, transistor 85 and resistor 86 form a simple inverter, one suited for converting the signals at the output of the first comparator to voltage levels suitable for operating the following complementary metal oxide semiconductor (CMOS) field-effect transistor logic circuitry. CMOS logic circuitry is used in the remainder of the circuit as shown in FIG. 2B because of the compatibility it provides with similar logic circuits used in switching arrangement 23 of FIG. 1. The circuitry of FIG. 2A and 2B can be provided in a monolithic integrated circuit chip using a BICMOS fabrication process.

Similarly, the junction of the collector of transistor 75 and resistor 79, as the output of the second comparator, is connected to the base of a Schottky npn bipolar transistor, 87, shown in FIG. 2B, having its emitter connected to ground reference terminal 31. The collector of transistor 87 is connected through a resistor, 88, to positive voltage supply terminal 30, and again has a typical resistance value of 9.989 kΩ. Once more, transistor 87 and resistor 88 together form a simple inverter accommodating the voltages of the output of the second comparator to those suited for operating subsequent CMOS logic circuits.

The collector of transistor 85 is connected to the input of a first CMOS inverter formed by a p-channel CMOS transistor, 89, and an n-channel CMOS transistor, 90, having their drains connected together as the inverter output and their gates connected together as the inverter input and so also connected to the collector of transistor 85. The sources of transistors 89 and 90 are connected to positive voltage supply terminal 30 and ground reference terminal 31, respectively. The collector of transistor 85 is also connected to another inverter-like circuit formed by a p-channel CMOS transistor, 91, and an n-channel CMOS transistor, 92, with the gates of these transistors connected together and to the collector of transistor 85. However, the drains of these two transistors have a further pair of transistors therebetween, a p-channel CMOS transistor, 93, having its source connected to the drain of transistor 91 and its drain connected to the drain of the other transistor connected in-between which is a n-channel CMOS transistor, 94. The source of transistor 94 is connected to the drain of transistor 92. The output of the inverter formed by transistors 89 and 90, taken at the common drain connection thereof, is connected to the gate of transistor 94.

The collector of transistor 87 is also connected to the input of another CMOS inverter formed by a p-channel CMOS transistor, 95, and a n-channel CMOS transistor, 96. The gates of transistors 95 and 96 are connected together as the inverter input and to the collector of transistor 87, and the drains of these two transistors are also connected together as the inverter output. The two transistors operate with their sources connected to positive voltage supply terminal 30, and ground reference terminal 31, respectively. The collector of transistor 87 is also connected to the input of another inverter-like circuit formed by a p-channel CMOS transistor, 97, and a n-channel CMOS transistor, 98, but with a further pair of transistors connected between the sources of these transistors and the power supply and ground reference terminals. Transistors 97 and 98 have their gates connected together and to the collector of transistor 87. The drains of transistors 97 and 98 are also connected together, but the source of transistor 97 is connected to the drain of a further p-channel CMOS transistor, 99, having its source connected to positive voltage supply terminal 30. The source of transistor 98 is connected to the drain of another n-channel CMOS transistor, 100, which has its source connected to ground reference terminal 31.

The output of the inverter formed by transistors 95 and 96 is connected to the gate of transistor 100 and to the gate of transistor 93. The output of the inverter formed by transistors 89 and 90 is also connected to the gate of transistor 99 in addition to the connection to the gate of transistor 94. In addition, there is a direct connection between the junction of the drains of transistors 97 and 98 and the drains of transistors 93 and 94, and a direct connection between the drain of transistor 100 and the drain of transistor 92.

The circuitry as described so far appearing in FIG. 2B forms a logic gate performing the EXCLUSIVE OR logic function. That is, the outputs of the first comparator, based on transistors 73 and 76, and of the second comparator, based on transistors 75 and 78, are connected to the inputs of this EXCLUSIVE OR gate at the bases of transistors 85 and 87, and the signals thereat are subjected to the EXCLUSIVE OR logic function to provide a logic signal at the output of the gate taken at the junction of the drains of transistors 93 and 94 and provided at an output terminal, 101. Output terminal 101 as the excess imbalance detector output is connected to switching arrangement 23 in FIG. 1.

This output signal is also used to operate a further inverter formed of a p-channel CMOS transistor, 102, and a n-channel CMOS transistor, 103. The gates of transistors 102 and 103 are connected together as the input and to the junction of the drains of transistors 93 and 94, i.e. to output terminal 101, and the drains of transistors 102 and 103 are also connected together as the output and to the gate of a further p-channel transistor, 104, shown in FIG. 2A. The sources of transistors 102 and 103 are connected to positive voltage supply terminal 30 and ground reference terminal 31, respectively.

Transistor 104 is used as a switch to enable and disable a current source used to adjust the output voltage of the threshold circuit in FIG. 2A to a different value. This current source is formed from a further pnp bipolar transistor, 105, having its base and collector connected directly together and to the current sink at the collector of transistor 43 which draws a reference current from the collector of transistor 105. The emitter of transistor 105 is connected through a resistor, 106, to positive voltage supply terminal 30 which has a typical resistance value of 0.389 kΩ. A further pnp bipolar transistor, 107, is connected in a current mirror configuration with transistor 105 by having the base thereof connected to the base of transistor 105. The emitter of transmitter 107 is connected through a further resistor, 108, to positive voltage supply terminal 30 which has a typical resistance value of 2.217 kΩ. The collector of transistor 107 is connected to the base of transistor 80 and to the collector of transistor 83 and, further, to resistor 82.

When the output signal from the EXCLUSIVE OR logic gate in FIG. 2B is in the high voltage value logic state, the output of the inverter formed by transistors 102 and 103 is in the low logic state so that transistor 104 is switched into the "on" condition connecting the collector of transistor 105 directly to positive voltage supply terminal 30. This places both transistors 105 and 107 in the "off" condition preventing any current being supplied by the collector of transistor 107 to the threshold circuit. This leaves the voltage established at the output of that circuit, taken at the emitter of transistor 80, at the value established by the current through diode 81 and resistor 82 in supplying the current which is taken up by the current sink at the collector of transistor 42, and by the base-emitter voltage drop of transistor 80.

However, with the output signal of the EXCLUSIVE OR logic gate in FIG. 2B being in the low voltage logic state, the output signal of the inverter formed by transistors 102 and 103 is in the high voltage logic state forcing transistor 104 into the "off" condition. This places transistors 105 and 107 in the "on" condition so that transistor 107 delivers a collector current which supplies part of the current being drawn by the current sink at the collector of transistor 42. As a result, less current flows through diode 81 and resistor 82 to thereby raise the voltage at the output of the threshold circuit taken at the emitter of transmitter 80.

In operation, the input signals occurring at input terminals 63 and 64 when the magnetic storage unit is operating normally in an information retrieval mode will have relatively small differences therebetween. As will be seen below, this leads to the output signal on terminal 101 being in the low voltage logic state so that transistor 104 is in the "off" condition. This results in collector current being supplied by transistor 107 to make up part of the current being sunk at the collector of transistor 42 thereby raising the voltage at the emitter of transmitter 80. Hence, the reference voltage for the first comparator formed of transistors 73 and 76 and the second comparator formed of transistors 75 and 78 will be of a relatively high value compared to the voltages occurring at the emitters of transistors 72 and 74 at the outputs of the input differential amplifier. As a result, transistors 73 and 75 will be in the "on" condition leading to voltage drops across resistors 77 and 79, and to the forward biasing of the base-emitter junctions of transistors 85 and 87. This leads to the EXCLUSIVE OR logic gate shown in FIG. 2B forcing its output at terminal 101 into the low voltage logic state as indicated above.

In the advent of a modal transition leading to a substantial change of operating conditions in preamplifier 11, a substantial voltage difference will occur between the signals on terminals 63 and 64 of the input differential amplifier. Assuming the change is such that voltage on terminal 63 becomes relatively much greater than that on terminal 64 (the same final result at output terminal 101 will follow in the opposite condition), nearly all of the current supplied through diode 71 to be taken up by the current sink at the collector of transistor 37 will flow through transistor 65 and load resistor 69 with very little current through transistor 66 and resistor 70. The resulting voltage drop across resistor 69 accordingly will be much greater than that across resistor 70, and this will keep transistor 73 in the first comparator in the "on" condition but place transistor 75 in the second comparator in the "off" condition. Accordingly, there will be a substantial voltage drop across resistor 77 but very little across resistor 79.

These outputs of the load resistors in the first and second comparators will result in transistor 85 having its base-emitter junction forward biased thereby placing it in the "on" condition, but placing transistor 87 in the "off" condition. The application of the EXCLUSIVE OR logic function of the logic gate of FIG. 2B will result in the output signal of terminal 101 being in the high voltage logic state, and therefore in transistor 104 being switched into the "on" condition. In this condition, the drain and source of transistor 104 are at nearly the same voltage thereby switching transistors 105 and 107 into the "off" condition. This prevents current from the collector of 107 being supplied to make up part of the current being drawn by the current sink at the collector of transistor 42 so that essentially all of the current being sunk there must be supplied through diode 81 and resistor 82. As a result, the voltage at the output of the threshold circuit taken at the emitter of transistor 80 is decreased requiring the voltage differences between the terminals 63 and 64 of the input differential amplifier to become relatively small before the output signal of the EXCLUSIVE OR logic gate of FIG. 2B goes to the low voltage logic state to assure the voltage on capacitance 20 is adjusted to its new value by amplifier 19 during the modal transition before the transconductance thereof is reduced.

Although the present invention has been described with reference to preferred embodiments, workers skilled in the art will recognize that changes may be made in form and detail without departing from the spirit and scope of the invention.

What is claimed is:

1. A sensing system including a magnetoresistive sensor and a preamplifier subject to being directed into modal transitions between differing operating states therefor said system comprising:

said magnetoresistive sensor;

said preamplifier electrically connected to said magnetoresistive sensor at a terminal thereof to provide in a sensor operation and signal conversion subsystem therein, electrical current through said magnetoresistive sensor and conversions of resistance changes in said magnetoresistive sensor due to varying magnetic fields thereabout to differential output signals at a pair of subsystem outputs based on a capacitance therein charged by a variable amplification amplifier therein but also subject to providing said differential output signals at said pair of subsystem outputs of relatively larger magnitudes during modal transitions than during said conversions absent said modal transitions due to said capacitance;

an excess imbalance detector having a pair of inputs electrically connected to said pair of subsystem outputs and having an output, said excess imbalance detector for detecting, between said differential output signals each occurring on one of said pair of inputs thereof, magnitude differences reaching selected threshold values therein to provide an output signal on said output thereof indicating when such differences have been detected by being in one logic state and being in an alternative logic state absent such differences being detected, and further for changing said selected threshold values therein following detection of such differences; and a switch having an input coupled to said excess imbalance detector output and having an output coupled to said variable amplification amplifier in said preamplifier, said switch for providing an output signal at said output thereof selecting an amplification value for said amplifier if said excess imbalance detector output signal is in said one logic state and selecting another amplification value for said amplifier if said excess imbalance detector output signal is in said alternative logic state.

2. The system of claim 1 wherein said excess imbalance detector comprises:

a differential comparator having a pair of inputs serving as said excess imbalance detector inputs, a threshold adjustment input and a pair of outputs, said differential comparator for having output signals at said outputs thereof be in a selected group of logic states if magnitudes of signals occurring at said inputs thereof have magnitude differences which fail to reach said selected threshold values, but with one of said output signals being in an alternative group of logic states if magnitudes of signals occurring at said inputs thereof have differences that are beyond said selected threshold values, said differential comparator for maintaining a first threshold value therein for signals at said threshold adjustment input thereof being in a selected control logic state but of substituting a second threshold value for said first threshold value if signals at said threshold adjustment input thereof are in an alternative control logic state;

a signal status determiner having a pair of inputs each coupled to a corresponding one of said differential comparator outputs and having an'output serving as said excess imbalance detector output, said signal status determiner for having an output signal at said output thereof be in said one logic state if signals at said inputs thereof are in said selected group of logic states, but in said alternative logic state if signals at said inputs thereof are in said alternative group of logic states; and a threshold adjuster having an input coupled to said signal status determiner output and having an output coupled to provide said signals at said threshold adjustment input in said differential comparator, said threshold adjuster for having an output signal at said output thereof in a selected adjustment logic state if signals at said input thereof are in said one logic state and for having said output signal thereof in an alternative adjustments logic state if signals at said input thereof are in said alternative logic state.

3. An excess differential imbalance detection system for detecting magnitude differences between a pair of signals provided such that each of these signals occurs on a corresponding one of a selected pair of outputs of a circuit being monitored, said system having an output and having a pair of inputs with each input of said pair thereof being coupled to a said corresponding one of said pair of outputs of said circuit being monitored, said system comprising:

a differential comparator having a pair of inputs serving as said pair of system inputs, a threshold adjustment input and a pair of outputs, said differential comparator for having output signals at said outputs thereof be in a selected group of logic states if magnitudes of signals occurring at said inputs thereof have magnitude differences which fail to reach selected threshold values, but with one of said output signals being in an alternative group of logic states if magnitudes of signals occurring at said inputs thereof have differences that are beyond said selected threshold values, said differential comparator for maintaining a first threshold value therein for signals at said threshold adjustment input thereof being in a selected control logic state but of substituting a second threshold value for said first threshold value if signals at said threshold adjustment input thereof are in an alternative control logic state;

a signal status determiner having a pair of inputs each coupled to a corresponding one of said differential comparator outputs and having an output serving as said system output, said signal status determiner for having an output signal at said output thereof be in a selected logic state if signals at said inputs thereof are in said selected group of logic states, but in an alternative logic state if signals at said inputs thereof are in said alternative group of logic states; and a threshold adjuster having an input coupled to said signal status determiner output and having an output coupled to provide said signals at said threshold adjustment input in said differential comparator, said threshold adjuster for having an output signal at said output thereof in a selected adjustment logic state if signals at said input thereof are in said selected logic state and for having said output signal thereof in an alternative adjustment logic state if signals at said input thereof are in said alternative logic state.

4. The system of claim 2 wherein said differential comparator comprises an input differential amplifier having a pair of inputs serving as said pair of differential comparator inputs and having a pair of outputs, a threshold value setting circuit having an output and being coupled to said threshold adjustment input, and a pair of internal comparators each having an output serving as one of said differential comparator pair of outputs and each having a pair of inputs with one of those inputs of each said internal comparator input pair being connected to said threshold value setting circuit output and that remaining input of each said internal comparator input pair being connected to a corresponding one of said differential amplifier outputs.

5. The system of claim 2 wherein said signal status determiner is an EXCLUSIVE OR logic gate.

6. The system of claim 4 wherein said threshold value setting circuit comprises a voltage value setting circuit having an output serving as said threshold value setting circuit output and providing a first voltage value at said output thereof based on a selected magnitude of current flowing through a resistance and of providing a second voltage value at said output thereof based on a different selected magnitude of current flowing through said resistance due to a switching means controlling said current flow through said resistance, said switching means having a control input therefor serving as said differential comparator threshold adjustment input.

7. The system of claim 4 wherein said threshold adjuster comprises an inverter logic gate having an input serving as said threshold adjuster input and having an output serving as said output coupled to said threshold adjustment input.

8. The system of claim 3 wherein said differential comparator comprises an input differential amplifier having a pair of inputs serving as said pair of differential comparator inputs and having a pair of outputs, a threshold value setting circuit having an output and being coupled to said threshold adjustment input, and a pair of internal comparators each having an output serving as one of said differential comparator pair of outputs and each having a pair of inputs with one of those inputs of each said internal comparator input pair being connected to said threshold value setting circuit output and that remaining input of each said internal comparator input pair being connected to a corresponding one of said differential amplifier outputs.

9. The system of claim 3 wherein said signal status determiner is an EXCLUSIVE OR logic gate.

10. The system of claim 8 wherein said threshold value setting circuit comprises a voltage value setting circuit providing a first voltage value at said output thereof based on a selected magnitude of current flowing through a resistance and of providing a second voltage value at said output thereof based on a different selected magnitude of current flowing through said resistance due to a switching means controlling said current flow through said resistance, said switching means having a control input therefor serving as said differential comparator threshold adjustment input.

11. The system of claim 8 wherein said threshold adjuster comprises an inverter logic gate having an input serving as said threshold adjuster input and having an output serving as said output coupled to said threshold adjustment input.

* * * * *

UNITED STATES PATENT AND TRADEMARK OFFICE
CERTIFICATE OF CORRECTION

PATENT NO. : 5,781,042
DATED : JULY 14, 1998
INVENTOR(S) : PETER J. JUNG

It is certified that error appears in the above-identified patent and that said Letters Patent is hereby corrected as shown below:

Col. 11, line 33, after "therefor", insert --,--

Col. 11, line 38, after "provide", insert --,--

Col. 12, line 28, after "an" delete --'--

Signed and Sealed this

Twenty-first Day of September, 1999

Attest:

Q. TODD DICKINSON

*Attesting Officer*  *Acting Commissioner of Patents and Trademarks*